(12) United States Patent
Hong et al.

(10) Patent No.: US 10,387,500 B2
(45) Date of Patent: Aug. 20, 2019

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventors: Hee Bum Hong, Hwaseong-si (KR); Chang Min Hong, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 63 days.

(21) Appl. No.: 15/830,381

(22) Filed: Dec. 4, 2017

(65) Prior Publication Data
US 2018/0181679 A1   Jun. 28, 2018

(30) Foreign Application Priority Data
Dec. 26, 2016   (KR) .................. 10-2016-0178886

(51) Int. Cl.
| | |
|---|---|
| H01L 27/11 | (2006.01) |
| G06F 16/903 | (2019.01) |
| H01L 27/088 | (2006.01) |
| H01L 27/105 | (2006.01) |
| G11C 15/04 | (2006.01) |
| H01L 29/78 | (2006.01) |
| H01L 29/66 | (2006.01) |
| H01L 29/417 | (2006.01) |

(52) U.S. Cl.
CPC .... *G06F 16/90339* (2019.01); *H01L 27/0886* (2013.01); *H01L 27/1052* (2013.01); *H01L 27/1104* (2013.01); *H01L 29/41775* (2013.01); *H01L 29/66621* (2013.01); *H01L 29/785* (2013.01); *G11C 15/04* (2013.01)

(58) Field of Classification Search
CPC .... G11C 15/04; H01L 29/785; H10S 438/926
See application file for complete search history.

(56) References Cited

U.S. PATENT DOCUMENTS

| | | | |
|---|---|---|---|
| 6,678,184 | B2 | 1/2004 | Lysinger et al. |
| 7,042,717 | B2 | 5/2006 | El-Batal et al. |
| 7,233,032 | B2 | 6/2007 | Liaw |
| 7,304,874 | B2 | 12/2007 | Venkatraman et al. |
| 8,059,452 | B2 | 11/2011 | Liaw |

(Continued)

FOREIGN PATENT DOCUMENTS

KR   10-2005-0066553 A   6/2005

*Primary Examiner* — Charles D Garber
*Assistant Examiner* — Alia Sabur
(74) *Attorney, Agent, or Firm* — Lee & Morse, P.C.

(57) ABSTRACT

A semiconductor device includes a fin, first to fourth gate electrodes, first and second storage devices, first and second search terminals, and first and second dummy search terminals. The fin extend in a first direction. The gate electrodes intersecting the fin. The storage devices are connected with the gate electrodes. The first search terminal is connected with the second gate electrode and is spaced from the fin by a first distance. The second search terminal is connected with the third gate electrode and is spaced from the fin by a second distance different from the first distance. The first dummy search terminal is connected with the second gate electrode and is spaced from the fin by the second distance. The second dummy search terminal is connected with the third gate electrode and is spaced from the fin by the first distance.

20 Claims, 13 Drawing Sheets

(56) References Cited

U.S. PATENT DOCUMENTS

| | | |
|---|---|---|
| 8,582,352 B2 | 11/2013 | Liaw |
| 8,964,470 B2 | 2/2015 | Lee |
| 9,183,933 B2 | 11/2015 | Liaw |
| 9,412,745 B1 | 8/2016 | Hung et al. |
| 2015/0200010 A1* | 7/2015 | Liaw ..................... G11C 15/04 257/390 |

* cited by examiner

SEMICONDUCTOR DEVICE AND METHOD FOR FABRICATING THE SAME

CROSS-REFERENCE TO RELATED APPLICATION

This application claims priority from Korean Patent Application No. 10-2016-0178886, filed on Dec. 26, 2016, and all the benefits accruing therefrom under 35 U.S.C. 119, the contents of which in its entirety are herein incorporated by reference.

BACKGROUND

1. Field

One or more embodiments described herein relate to a semiconductor device and a method for fabricating a semiconductor device.

2. Description of the Related Art

A content-addressable memory (CAM), or associative memory, is a specialized memory used in a fast search application. Unlike a random access memory (RAM), which searches and provides data corresponding only to a specific memory address, a CAM searches its entire memory space and returns the address where a corresponding query is located, and in some cases data associated with the query.

A CAM may be implemented as a static random access memory (SRAM) including a storage cells and a port for performing a comparison operation. Each storage cell in the CAM may be a NOR-type or NAND-type cell.

A CAM with NOR-type cells may be faster than a CAM with NAND-type cells. A CAM with NOR-type cells, therefore, be used more often. One type of NOR-type CAM has a 16-transistor (16T) configuration and may be referred to as a ternary CAM (TCAM). Another type of NOR-type CAM has a 10-transistor (10T) configuration and may be referred to as a binary CAM (BCAM).

A BCAM may operate based on a query consisting of 1 and 0 only. A TCAM may operate based on a query that includes "X" (Don't Care) as well as 1 and 0, and thus may provide greater flexibility in searching. For example, when the TCAM searches with "10XX0," a four-query search of "10000," "10010," "10100," and "10110" is performed. Such a TCAM, however, is relatively expensive to implement, e.g, a TCAM uses an additional memory to store an "X" state compared to a BCAM.

SUMMARY

In accordance with one or more embodiments, a semiconductor device includes a fin extending in a first direction; first to fourth gate electrodes intersecting the fin; first and second storage devices connected with the first and fourth gate electrodes respectively; a first search terminal connected with the second gate electrode and spaced from the fin by a first distance; a second search terminal connected with the third gate electrode and spaced from the fin by a second distance different from the first distance; a first dummy search terminal connected with the second gate electrode and spaced from the fin by the second distance; and a second dummy search terminal connected with the third gate electrode and spaced from the fin by the first distance.

In accordance with one or more other embodiments, a semiconductor device includes first to sixth fins extending in parallel in a first direction, the first to third, fifth, and sixth fins sequentially spaced in a second direction crossing the first direction, the first, second, and fourth to sixth fins sequentially spaced in the second direction, and the third and fourth fins spaced in the first direction; a first gate electrode intersecting the first, second, and third fins and extending in the second direction; a second gate electrode intersecting the first, second, and fourth fins and extending in the second direction; a third gate electrode intersecting the second, third, fifth, and sixth fins and extending in the second direction; a fourth gate electrode intersecting the second and fourth to sixth fins and extending in the second direction; fifth and sixth gate electrodes between the third and fourth gate electrodes, intersecting the sixth fin, and extending in the second direction, the fifth and sixth gate electrodes spaced apart from each other in the first direction; a first search terminal connected with the fifth gate electrode and spaced from the sixth fin by a first distance; a second search terminal connected with the sixth gate electrode and spaced from the sixth fin by a second distance different from the first distance; a first dummy search terminal connected with the fifth gate electrode and spaced from the sixth fin by the second distance; and a second dummy search terminal connected with the sixth gate electrode and spaced from the sixth fin by the first distance.

In accordance with one or more other embodiments, a semiconductor device includes a fin extending in a first direction; first and second gate electrodes intersecting the fin; a first search terminal connected with the first gate electrode and spaced from the fin by a first distance; a second search terminal connected with the second gate electrode and spaced from the fin by a second distance different from the first distance; a first dummy search terminal connected with the first gate electrode and spaced from the fin by the second distance; a second dummy search terminal connected with the second gate electrode and spaced from the fin by the first distance; a first wire extending in the first direction on the first search terminal and the second dummy search terminal, the first wire electrically connected with the first search terminal and electrically insulated from the second dummy search terminal; and a second wire extending in the first direction on the second search terminal and the first dummy search terminal, the second wire electrically connected with the second search terminal and electrically insulated from the first dummy search terminal.

In accordance with one or more other embodiments, a semiconductor device includes a fin extending in a first direction; first to fourth gate electrodes intersecting the fin; first and second storage devices connected with the first and fourth gate electrodes respectively; a first search terminal connected with the second gate electrode and spaced from the fin by a first distance; a second search terminal connected with the third gate electrode and spaced from the fin by a second distance different from the first distance; a first dummy search terminal connected with the second gate electrode, the first search terminal between the first dummy search terminal and the fin; and a second dummy search terminal connected with the third gate electrode and between the fin and the second search terminal.

In accordance with one or more other embodiments, a semiconductor device includes a fin extending in a first direction; first and second gate electrodes intersecting the fin; a first search terminal, connected with the first gate electrode, spaced from the fin by a first distance, and to receive a first voltage of a first magnitude at a first time point; a second search terminal connected with the second gate electrode, spaced from the fin by a second distance different from the first distance, and to receive a second voltage of a second magnitude different from the first magnitude, at the first time point, the first and second voltages being opposite digital signals to each other; a first dummy search terminal connected with the first gate electrode, the first search terminal between the first search terminal and the fin; a second dummy search terminal connected with the second gate electrode and between the fin and the second search terminal; and a match line terminal between the first and second electrodes, the match line to be pre-charged at a second time point earlier than the first time point and to output a match signal at a third time point later than the first time point.

In accordance with one or more other embodiments, a semiconductor device includes a first SRAM cell including first and second inverters and first and second pass-gate transistors; a second SRAM cell including third and fourth inverters and third and fourth pass-gate transistors; a first transistor connected with an input of the first inverter and an output of the second inverter; a second transistor connected with an input of the fourth inverter and an output of the third inverter; third and fourth transistors connected in series with the first and second transistors, the third and fourth transistors sharing a same fin-type pattern and including respective first and second gate electrodes intersecting the fin-type pattern; a first search terminal connected with the first gate electrode and spaced from the fin-type pattern by a first distance; a second search terminal connected with the second gate electrode and spaced from the fin-type pattern by a second distance different from the first distance, the first search terminal and the second search terminal to receive opposite signals; a first dummy search terminal connected with the first gate electrode and spaced from the fin-type pattern by the second distance; and a second dummy search terminal connected with the second gate electrode and spaced from the fin-type pattern by the first distance.

In accordance with one or more other embodiments, a method for fabricating a semiconductor device includes forming a fin extending in a first direction; forming first and second gate electrodes intersecting the fin; forming a first search terminal contact connected with the first gate electrode and spaced from the fin by a first distance, a second search terminal contact connected with the second gate electrode and spaced from the fin by a second distance different from the first distance, a first dummy search terminal contact connected with the first gate electrode and spaced from the fin by the second distance, and a second dummy search terminal contact connected with the second gate electrode and spaced from the fin by the first distance; and forming a first wire extending in the first direction on the first search terminal and the second dummy search terminal and a second wire extending in the first direction on the second search terminal and the first dummy search terminal, the first wire electrically connected with the first search terminal and electrically insulated from the second dummy search terminal, and the second wire electrically connected with the second search terminal and electrically insulated from the first dummy search terminal.

In accordance with one or more other embodiments, a semiconductor device includes a fin; gate electrodes; storage devices connected with the gate electrodes; a first search terminal connected with a first gate electrode of the gate electrodes and spaced from the fin by a first distance; a second search terminal connected with a second gate electrode of the gate electrodes and spaced from the fin by a second distance different from the first distance; a first dummy search terminal connected with the first gate electrode and spaced from the fin by the second distance; and a second dummy search terminal connected with the second gate electrode and spaced from the fin by the first distance, wherein the first and second search terminals are spaced from the fin by different distances and wherein the first and second dummy search terminals are spaced from the fin by different distances.

BRIEF DESCRIPTION OF THE DRAWINGS

Features will become apparent to those of skill in the art by describing in detail exemplary embodiments with reference to the attached drawings in which.

DETAILED DESCRIPTION

Referring to FIGS. 1 to 9, a semiconductor substrate includes a substrate 100, first to ninth fins F1-F9, first to tenth gate electrodes G1-G10, first to eighteenth lower contacts CS1-CS18, first to eighth gate contacts CG1-CG8, first and second real contacts RC1, RC2, first to second dummy contacts DC1, DC2, first to twelfth upper contacts C1-C12, and first to thirteenth lower wires L1-L13. The substrate 100 may include one or more semiconductor materials including but not limited to Si, Ge, SiGe, GaP, GaAs, SiC, SiGeC, InAs, or InP. In one embodiment, a substrate 100 may be a silicon-on-insulator (SOI) substrate.

Figure 1:
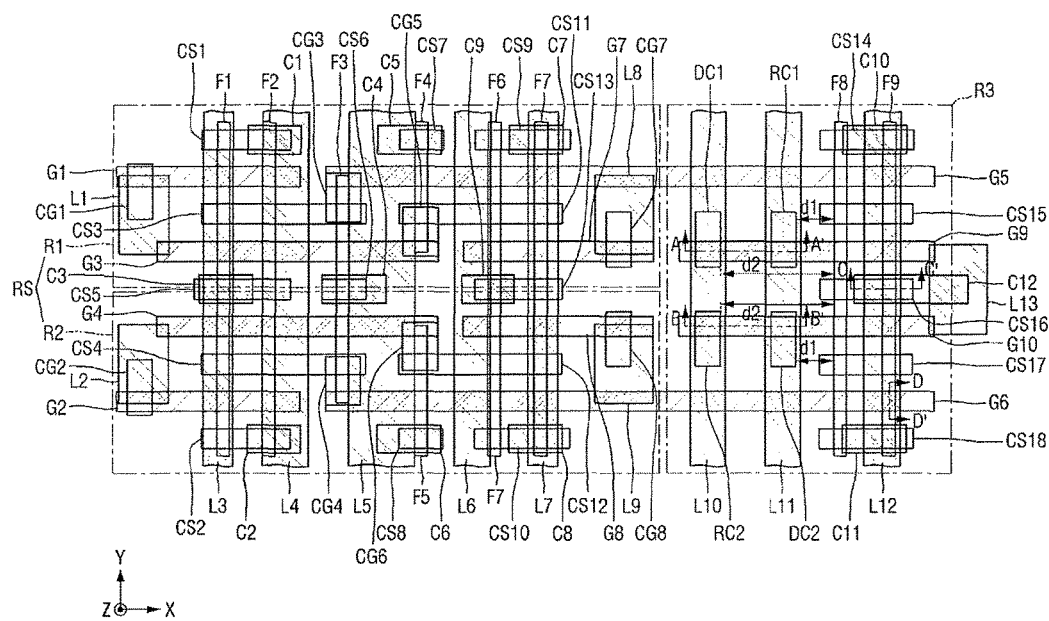
FIG. 1 illustrates a layout embodiment of a semiconductor device.

The substrate 100 may include first to third regions R1-R3. As illustrated in FIG. 1, the first to third regions may be formed by dividing an entire region of a rectangular shape into three equal parts. The first region R1 and the second region R2 may be adjacent to each other in a second direction Y. The first region R1 and the third region R3 may be adjacent to each other in a first direction. Further, the second region R2 and the third region R3 may be adjacent to each other in the first direction. Accordingly, a boundary line of the first to third regions R1-R3 may have a T shape.

For example, a boundary line between the first region R1 and the second region R2 may extend in the first direction X. A boundary line between the first region R1 and the third region R3 may extend in the second direction Y. A boundary line between the second region R2 and the third region R3 may also extend in the second direction Y, and may be connected with the boundary line between the first region R1 and the third region R3.

In one embodiment, the first direction X and the second direction Y may be orthogonal to each other. In one embodiment, a third direction Z may be orthogonal to the first direction X and the second direction Y, e.g., the first to third directions X, Y, Z may be all orthogonal directions.

The first region R1 and the second region R2 may be storage regions RS, e.g., the first region R1 and the second region R2 may be formed with a storage device respectively. In an example, the storage device may be a static random access memory (SRAM). The third region R3 may include a comparator for comparing signals of the first region R1 and the second region R2 with each other may be formed. As a result, the semiconductor device according to some exemplary embodiments illustrated in FIG. 1 may form a ternary content-addressable memory (TCAM) cell with the storage regions RS and the third region R3, e.g., a comparison region.

Figure 2:
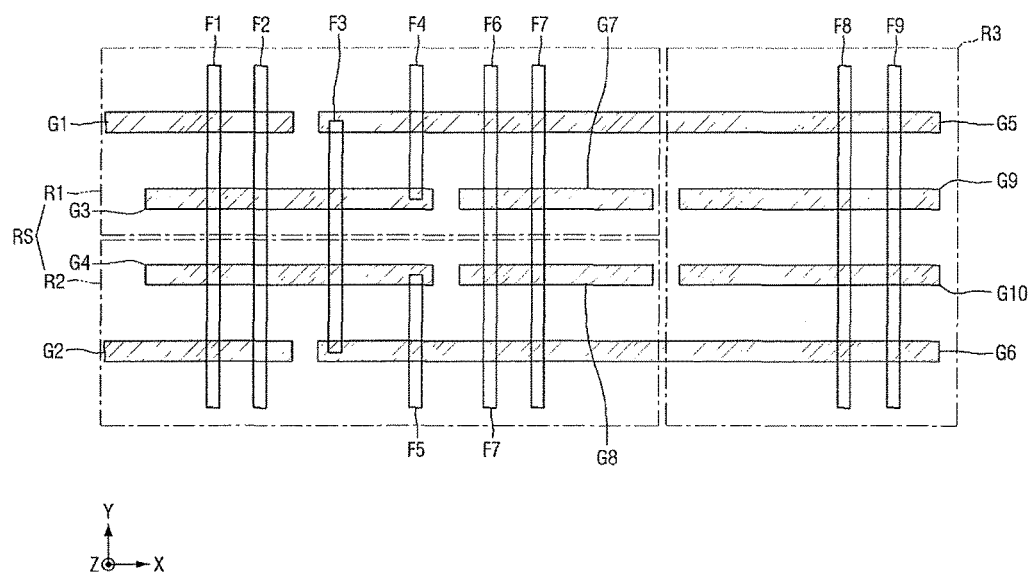
FIG. 2 illustrates a layout embodiment of a first level stage.

Referring to FIG. 2, the first to ninth fins F1-F9 may extend in the second direction Y and may be spaced apart from each other in the first direction X. The first to ninth fins F1-F9 may be sequentially disposed in the first direction X.

The first fin F1, the second fin F2, the sixth fin F6, the seventh fin F7, the eighth fin F8, and the ninth fin F9 may have a same length in the second direction Y within the TCAM cell of the semiconductor device. In one embodiment, the third fin F3, the fourth fin F4, and the fifth fin F5 may be short in the second direction Y within the TCAM cell. For example, in one embodiment, all ends of the third fin F3 in the second direction Y may not reach a boundary of the TCAM cell, e.g., a boundary of the storage region RS in the second direction Y. Thus, the third fin F3 may be on a center of the second direction Y within the storage region RS.

The fourth fin F4 and the fifth fin F5 may overlap in the second direction Y and may be spaced apart from each other in the second direction Y. The fourth fin F4 and the fifth fin F5 may be fins formed by cutting one integral fin into two separate fins. Accordingly, the fourth fin F4 may be within the first region R1 and the fifth fin F5 may be within the second region R2.

The first to seventh fins F1-F7 may be on the storage region RS. For example, other fins excluding the fifth fin F5 among the first to seventh fins F1-F7 may be on the first region R1, and other fins excluding the fourth fin F4 among the first to seventh fins F1-F7 may be on the second region R2. Thus, the first region R1 and the second region R2 may share the first to third fins F1-F3, the sixth fin F6, and the seventh fin F7, and may exclusively include the fourth fin F4 and the fifth fin F5, respectively.

The eighth fin F8 and the ninth fin F9 may be on the third region R3, i.e., the comparison region.

The first to tenth gate electrodes G1-G10 may extend in the first direction X, and may be spaced apart from each other in the first direction X and the second direction Y. For example, the first to second gate electrodes G1, G2 may intersect the first and second fins F1, F2 on the first and second fins F1, F2, respectively. The third gate electrode G3 may intersect the first to fourth fins F1-F4. The fourth gate electrode G4 may intersect the first to third fins F1-F3 and fifth fin F5. The fifth gate electrode G5 may intersect the third, fourth, and sixth to ninth fins F3, F4, F6-F9. The sixth gate electrode G6 may intersect the third and fifth to ninth fins F3, F5-F9. The seventh and eighth gate electrodes G7, G8 may intersect the sixth and seventh fins F6, F7. The ninth and tenth gate electrodes G9, G10 may intersect the eighth and ninth fins F8, F9.

The first to ninth fins F1-F9 and the first to tenth gate electrodes G1-G10 may be disposed symmetrically about the boundary line extending in the first direction X between the first region R1 and the second region R2 as an axis. This symmetry is to reduce or minimize distribution of performances such as threshold voltage of the gate electrode according to position of the semiconductor device.

The first gate electrode G1 and the fifth gate electrode G5 may overlap in the first direction X and may be spaced apart from each other in the first direction X. The gate electrodes, formed as described above, may result from dividing an integral gate electrode into two parts. Likewise, the second gate electrode G2 and the sixth gate electrode G6 may result from dividing an integral gate electrode formed to extend in the first direction X into two parts.

The third gate electrode G3, the seventh gate electrode G7, and the ninth gate electrode G9 may result from dividing an integral gate electrode formed to extend in the first direction X into three parts. Likewise, the fourth gate electrode G4, the eighth gate electrode G8, and the tenth gate electrode G10 may result from dividing an integral gate electrode formed to extend in the first direction X into three parts.

A source/drain may be formed on different sides of the first to tenth gate electrodes G1-G10 on the first to ninth fins F1-F9. For example, the source/drain may correspond to the first source/drain 160 in FIG. 5 and the second source/drain 120 in FIG. 6.

Figure 3:
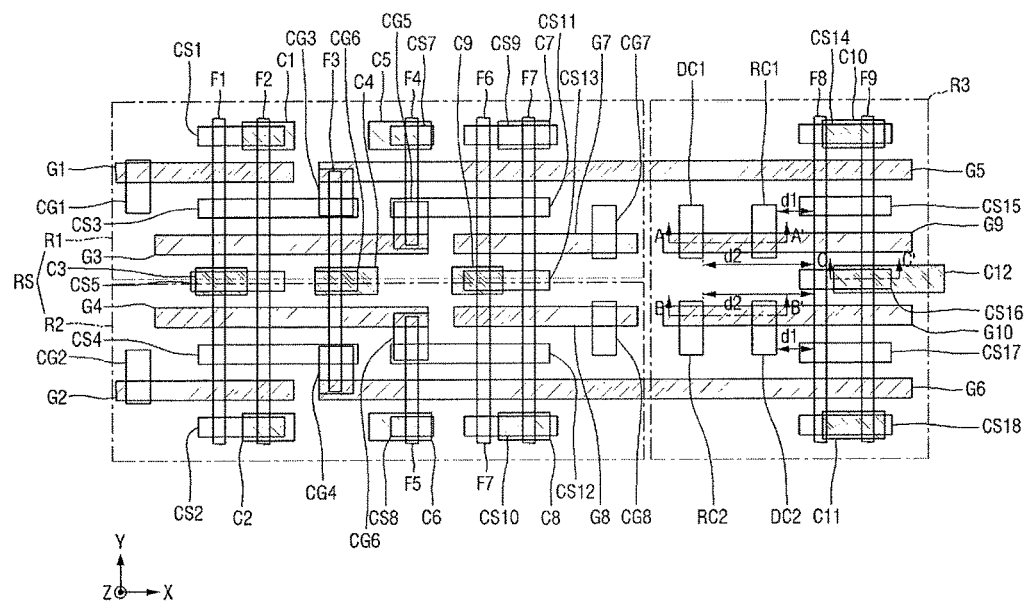
FIG. 3 illustrates a layout embodiment of first to third level stages.

FIG. 3 illustrates first to eighteenth lower contacts CS1-CS18 formed on the source/drain, first to eighth gate contacts CG1-CG8 formed on the first to tenth gate electrodes G1-G10, first and second real contacts RC1, RC2, first to second dummy contacts DC1, DC2, and first to twelfth upper contacts C1-C12 formed on the first to eighteenth lower contacts CS1-CS18.

The first to eighteenth lower contacts CS1-CS18 may connect the source/drain with each other. Accordingly, the source/drain of the first and second fins F1, F2, the source/drain of the sixth and seventh fins F6, F7 and the source/drain of the eighth and ninth fins F8, F9 may be all shared.

The first to eighth gate contacts CG1-CG8 may connect the first to tenth gate electrodes G1-G10 with a structure of an upper level. The first and second real contacts RC1, RC2 and the first and second dummy contacts DC1, DC2 may be gate contacts formed simultaneously with the first to eighth gate contacts CG1-CG8. The expression, "simultaneous" as used herein may cover the situation where features are formed using a same process or the situation where minute time differences exist.

The first real contact RC1 may be spaced, by a first distance d1, from a transistor formed with the eighth and ninth fins F8, F9 and the ninth gate electrode G9 on the ninth gate electrode G9. The second real contact RC2 may be spaced, by a second distance d2, from a transistor formed with the eighth and ninth fins F8, F9 and the tenth gate electrode G10 on the tenth gate electrode G10. The first distance d1 may be different from (e.g., smaller than) the second distance d2.

Figure 4:
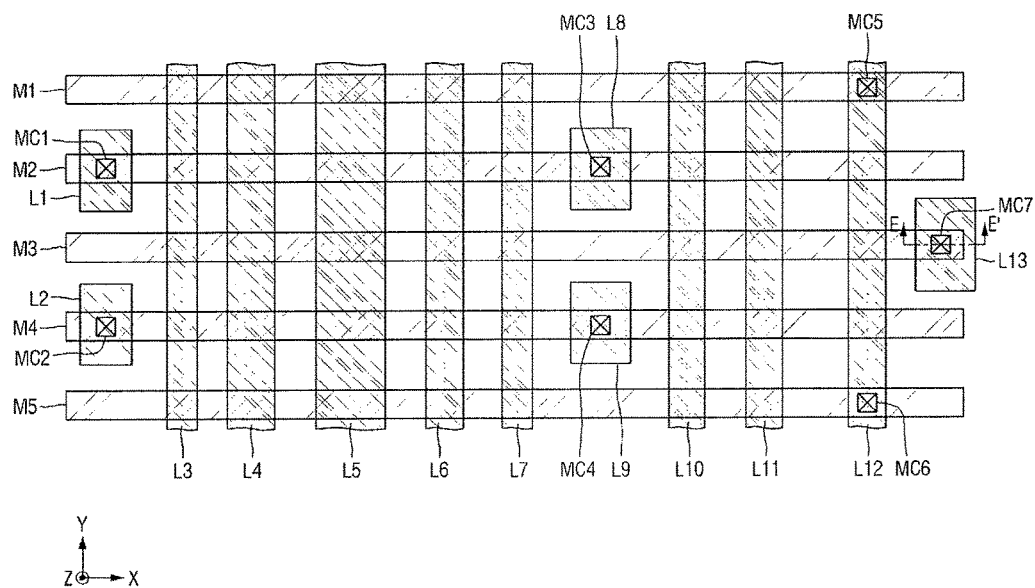
FIG. 4 illustrates a layout embodiment of a fourth level stage with fifth and sixth levels.

This design may allow the tenth lower wire L10 and the eleventh lower wire L11, illustrated in FIG. 1 or 4, to extend in the second direction Y without interfering with each other. For example, the first real contact RC1 and the second real contact RC2 may be spaced apart from each other by different distances so as to transmit different signals in terms of circuit and electricity.

When the distances between the first and second real contacts RC1, RC2, and the corresponding transistors are different from each other, an asymmetry may exist that deteriorates uniformity of the threshold voltages of the transistors. For example, a plasma treatment used in forming the first and second real contacts RC1, RC2 may influence the adjacent transistors respectively, and influence on the adjacent transistors may be applied in different degrees as their distances from the plasma-treated targets become different from each other. For example, the threshold voltages of the transistor formed with the eighth and ninth fins F8, F9 and the ninth gate electrode G9 and the transistor formed with the eighth and ninth fins F8, F9 and the tenth gate electrode G10 may be different from each other as a result of the aforementioned asymmetry.

Accordingly, even when a same signal is applied, different results may be obtained. This may lead to a problem in the overall reliability and performance of the semiconductor device.

The semiconductor device according to some exemplary embodiments may remove asymmetry through formation of the first and second dummy contacts DC1, DC2. For example, the first dummy contact DC1 may be formed on the ninth gate electrode G9 and spaced by the second distance d2 from the transistor formed with the eighth and ninth fins F8, F9 and the ninth gate electrode G9. Further, the second dummy contact DC2 may be formed on the tenth gate electrode G10 and spaced by the first distance d1 from the transistor formed with the eighth and ninth fins F8, F9 and the tenth gate electrode G10. Thus, the first dummy contact DC1 may overlap the first real contact RC1 in the second direction Y, and the second dummy contact DC2 may overlap the second real contact RC2 in the second direction Y.

The first to twelfth upper contacts C1-C12 may be formed on the first to eighteenth lower contacts CS1-CS18. The first to twelfth upper contacts C1-C12 may serve to connect the first to eighteenth lower contacts CS1-CS18 with the upper structure.

Referring to FIGS. 1 and 4, the first to thirteenth lower wires L1-L13 and first to seventh contacts MC1-MC7 and first to fifth upper wires M1-M5 will be described below. The third to seventh and tenth to twelfth lower wires L3-L7, L10-L12 may extend in parallel in the second direction Y and be spaced apart in the first direction X. The first, second, eighth, ninth, and thirteenth lower wires L1, L2, L8, L9, L13 may be isolated island types in both the first direction X and the second direction Y.

The first to thirteenth lower wires L1-L13 may be electrically connected with the first to eighth gate contacts CG1-CG8, the first and second real contacts RC1, RC2, and the first to twelfth upper contacts C1-C12. For example, the first lower wire L1 may be connected with the first gate contact CG1 and the second lower wire L2 may be connected with the second gate contact CG2. The third lower wire L3 may be connected with the third upper contact C3. The fourth lower wire L4 may be connected with the first and second upper contacts C1, C2. For example, the fourth lower wire L4 may connect the first and second upper contacts C1, C2 with each other. The fifth lower wire L5 may connect the fourth to sixth upper contacts C4-C6 with each other. The sixth lower wire L6 may be connected with the ninth upper contact C9. The seventh lower wire L7 may connect the seventh and eighth upper contacts C7, C8 with each other. The eighth lower wire L8 may be connected with the seventh gate contact CG7 and the ninth lower wire L9 may be connected with the eighth gate contact CG8.

The tenth lower wire L10 may be connected with the second real contact RC2, and the eleventh lower wire L11 may be connected with the first real contact RC1. The tenth lower wire L10 may overlap the first dummy contact DC1 in the third direction Z, but may not be connected to the first dummy contact DC1. The eleventh lower wire L11 may overlap the second dummy contact DC2 in the third direction Z, but may not be connected to the second dummy contact DC2.

The twelfth lower wire L12 may connect the tenth to twelfth upper contacts C10-C12 with each other. The thirteenth lower wire L13 may be connected with the twelfth upper contact C12.

The first to seventh contacts MC1-MC7 may be formed on the first to thirteenth lower wires L1-L13. The first to seventh contacts MC1-MC7 may connect the first to thirteenth lower wires L1-L13 with the upper structure. For example, the first contact MC1 may be on the first lower wire L1, the second contact MC2 may be on the second lower wire L2, the third contact MC3 may be on the eighth lower wire L8, the fourth contact MC4 may be on the ninth lower wire L9, the fifth contact MC5 and the sixth contact MC6 may be on the twelfth lower wire L12, and the seventh contact MC7 may be on the thirteenth lower wire L13.

The first to fifth upper wires M1-M5 may contact the first to seventh contacts MC1-MC7 on the first to thirteenth lower wires L1-L13 and the first to seventh contacts MC1-MC7. The first to fifth upper wires M1-M5 may extend in parallel in the first direction X and may be spaced apart from each other in the second direction Y. For example, the first upper wire M1 may be connected with the fifth contact MC5. The second upper wire M2 may connect the first contact MC1 and the third contact MC3. Accordingly, the first gate contact CG1 and the seventh gate contact CG7 may be electrically connected with each other.

The third upper wire M3 may be connected with the seventh contact MC7. The fourth upper wire M4 may connect the second contact MC2 and the fourth contact MC4. Accordingly, the second gate contact CG2 and the eighth gate contact CG8 may be electrically connected with each other.

The fifth upper wire M5 may be connected with the sixth contact MC6. For example, the first upper wire M1 and the fifth upper wire M5 may be connected with each other by the twelfth lower wire L12.

A cross-section of the semiconductor device according to some exemplary embodiments will be explained with reference to FIGS. 1 to 5. The semiconductor device may have first to sixth levels LV1-LV6 sequentially on the substrate 100. In an example, the first to sixth levels LV1-LV6 may be vertical height levels.

The first level LV1 may be formed with the first to tenth gate electrodes G1-G10, the first to ninth fins F1-F9, the source/drain such as the first source/drain 160 as illustrated, and the first lower contact CS1. Further, a first interlayer insulating film 150 may be formed in a position where the above constituent element is not formed.

In the present embodiment, upper surfaces of the constituent elements formed on the first level LV1 are the same. That is, in the semiconductor device according to some exemplary embodiments, an upper surface of each constituent element may be different.

The first and second real contacts RC1, RC2 and the first and second dummy contacts DC1, DC2 may be on the second level LV2. Further, the first to eighth gate contacts CG1-CG8 may be formed. Further, the first to twelfth upper contacts C1-C12 may be formed on the second level LV2. A second interlayer insulating film 250 may be formed on a portion where the above constituent elements are not formed.

First to third vias V1-V3 may be formed on the third level LV3. The vias may electrically connect the first and second real contacts RC1, RC2, the first to eighth gate contacts CG1-CG8, and the first to twelfth upper contacts C1-C12 with the first to thirteenth lower wires L1-L13. A third interlayer insulating film 350 may be formed on a portion where the constituent elements described above are not formed.

The first via V1 may connect the first real contact RC1 and the eleventh lower wire L11. The tenth lower wire L10 and the first dummy contact DC1 may overlap each other in the third direction Z, but may be insulated from each other. Likewise, the second via V2 may connect the second real contact RC2 and the tenth lower wire L10. The eleventh lower wire L11 and the second dummy contact DC2 may overlap each other in the third direction Z, but may be insulated from each other. The third via V3 may connect the eleventh upper contact C11 and the twelfth lower wire L12. Likewise, the via such as the third via V3 may connect the first to twelfth upper contacts C1-C12 and the first to thirteenth lower wires L1-L13.

The first to thirteenth lower wires L1-L13 may be formed on the fourth level LV4. A fourth interlayer insulating film 450 may be formed on a portion where the first to thirteenth lower wires L1-L13 are not formed.

Figure 5:
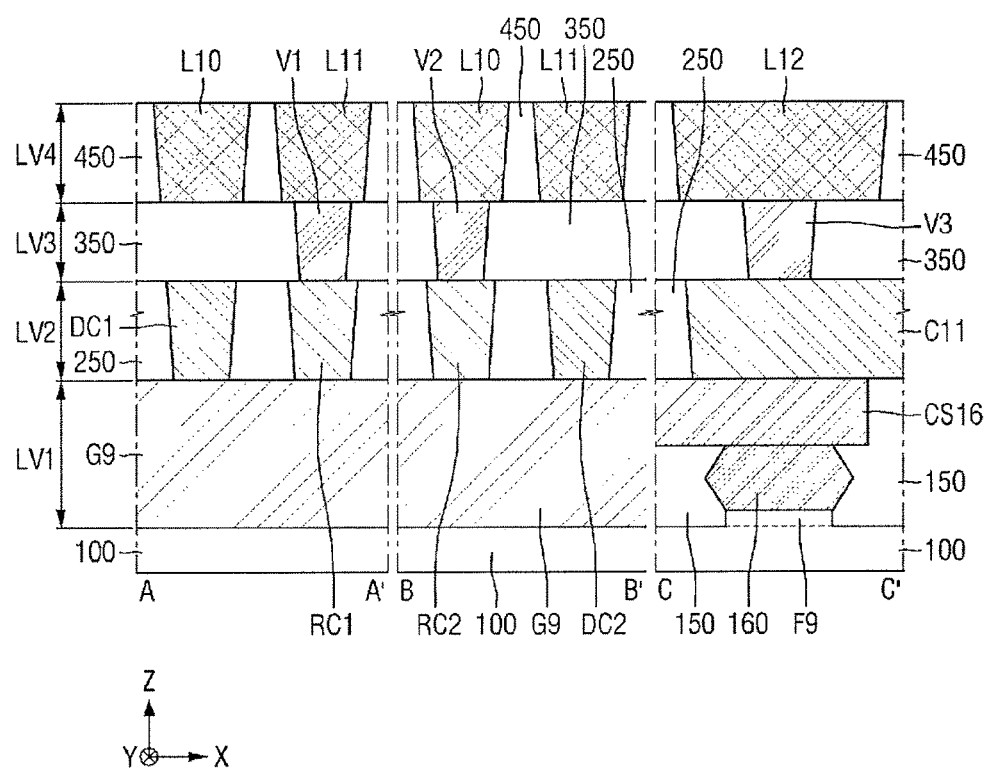
FIG. 5 illustrates a view along section lines A-A', B-B' and C-C' in FIG. 1.
Figure 6:
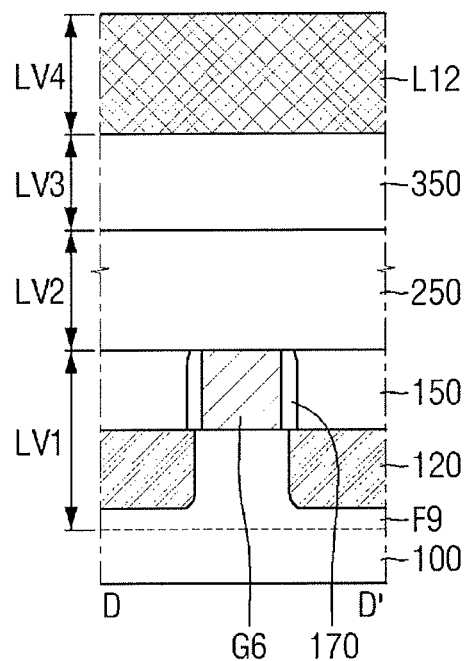
FIG. 6 illustrates a view along section line D-D' in FIG. 1.

Referring to FIGS. 5 and 6, a gate spacer 170 may be formed on a side surface of the sixth gate electrode G6 on the first level LV1. In one embodiment, the gate spacer may be formed on side surfaces of the first to fifth and seventh to tenth gate electrodes G1-G5, G7-G10 respectively as well as the sixth gate electrode G6.

Further, a gate insulating film may be formed on lower portions and side surfaces of the first to tenth gate electrodes G1-G10. Further, the first to tenth gate electrodes G1-G10 may be formed in a multi-film structure of work function metal and fill metal. Further, a capping film may be formed on the upper surfaces of the first to tenth gate electrodes G1-G10.

Further, the source/drain may be formed within the first to ninth fins F1-F9 and at the side surfaces of the first to tenth gate electrodes G1-G10. FIG. 6 exemplifies that the second source/drain 120 is buried at different sides of the sixth gate electrode G6. In FIG. 5, the first source/drain 160 may be formed in a pentagonal or hexagonal shape on the ninth fin F9. For example, the source/drain may have a pentagonal or hexagonal shape when cut in the first direction X, and may have a buried shape when cut in the second direction Y.

The source/drain such as the first source/drain 160 and the second source/drain 120 may include a material (such as SiGe doped with Boron B) when corresponding transistor is a PMOS, or may include a material such as Si or SiC doped with phosphorus P when corresponding transistor is an NMOS.

Figure 7:
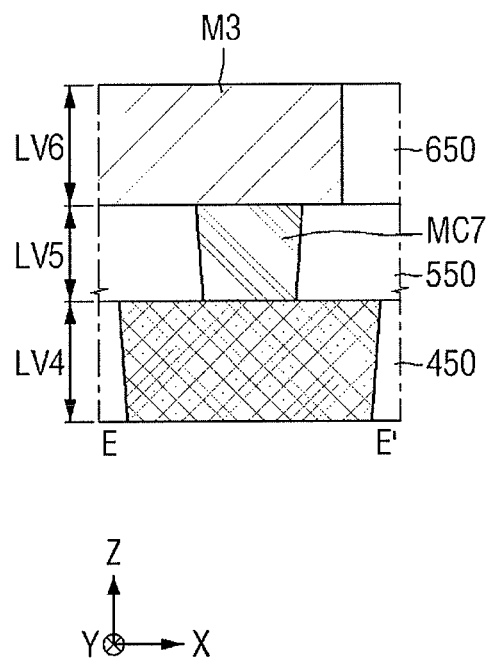
FIG. 7 illustrates a view along section line E-E' of FIG. 4.

Referring to FIGS. 1, 4, and 7, the fifth level LV5 and the sixth level LV6 will be explained below. The first to seventh contacts MC1-MC7 may be formed on the fifth level LV5.

A fifth interlayer insulating film 550 may be formed on a portion where the first to seventh contacts MC1-MC7 are not faulted.

The first to fifth upper wires M1-M5 may be formed on the sixth level LV6. A sixth interlayer insulating film 650 may be formed on a portion where the first to fifth upper wires M1-M5 are not formed.

The first to sixth interlayer insulating films 150-650 may include at least one of an oxide film, a nitride film, or an oxynitride film. The first to sixth interlayer insulating films 150-650 are illustrated to be single-layered films, but may be multi-layered films in another embodiment.

Figure 8:
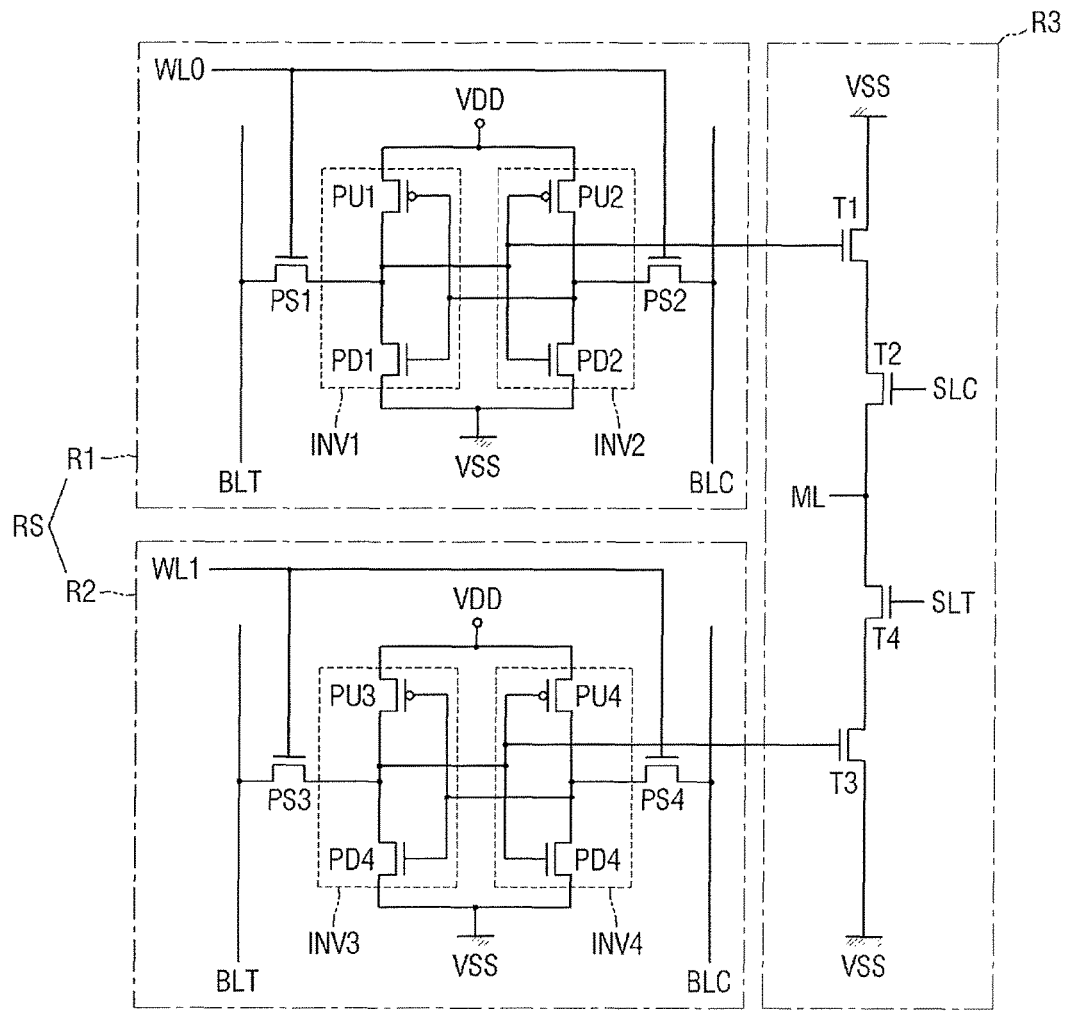
FIG. 8 illustrates a circuit embodiment of the semiconductor device.

Aspects of a semiconductor device in view of circuit according to some exemplary embodiments will be described with reference to FIGS. 8 and 9. As illustrated in FIG. 8, the first region R1 may include first and second inverters INV1, INV2, which are connected in parallel between a power terminal VDD and a ground terminal VSS, and a first pass-gate transistor PS1 and a second pass-gate transistor PS2, which are connected with an output terminal of the first and second inverters INV1, INV2. The first pass gate transistor PS1 and the second pass-gate transistor PS2 may be connected with a true bit line BLT and a complementary bit line BLC respectively. Gates of the first pass-gate transistor PS1 and the second pass-gate transistor PS2 may be connected with a first word line WL0.

The first inverter INV1 includes a first pull-up transistor PU1 and a first pull-down transistor PD1 connected in series. The second inverter INV2 includes a second pull-up transistor PU2 and a second pull-down transistor PD2 connected in series. The first pull-up transistor PU1 and the second pull-up transistor PU2 may be the p-channel MOSFET (PMOS) transistors. The first pull-down transistor PD1 and the second pull-down transistor PD2 may be the n-channel MOSFET (NMOS) transistors.

In order for the first inverter INV1 and the second inverter INV2 to construct one latch circuit, an input terminal of the first inverter INV1 is connected with the output terminal of the second inverter INV2, and the input terminal of the second inverter INV2 is connected with the output terminal of the first inverter INV1.

Similarly, the second region R2 may include third and fourth inverters INV3, INV4, which are connected in parallel between the power terminal VDD and the ground terminal VSS, and a third pass gate transistor PS3 and a fourth pass gate transistor PS4, which are connected with the output terminal of the third and fourth inverters INV3, INV4. The third pass gate transistor PS3 and the fourth pass gate transistor PS4 may be connected with the true bit line BLT and the complementary bit line BLC respectively. The gates of the third pass-gate transistor PS3 and the fourth pass-gate transistor PS4 may be connected with a second word line WL1.

The third inverter INV3 includes a third pull-up transistor PU3 and a third pull-down transistor PD3 connected in series. The fourth inverter INV4 includes a fourth pull-up transistor PU4 and a fourth pull-down transistor PD4 connected in series. The third pull-up transistor PU3 and the fourth pull-up transistor PU4 may be the PMOS transistors. The third pull-down transistor PD3 and the fourth pull-down transistor PD4 may be the NMOS transistors.

In order for the third inverter INV3 and the fourth inverter INV4 to construct one latch circuit, the input terminal of the third inverter INV3 is connected with the output terminal of the fourth inverter INV4, and the input terminal of the fourth inverter INV4 is connected with the output terminal of the third inverter INV3.

The third region R3 may include first to fourth transistors T1-T4. The first transistor T1 may connect between the ground terminal VSS and the second transistor in series using a voltage of the output terminal of the first inverter INV1 (input terminal of the second inverter INV2) as a gate voltage. The second transistor T2 may connect between a match line ML terminal and the first transistor T1 in series using a voltage of a complementary search line SLC terminal as a gate voltage.

The third transistor T3 may connect between the ground terminal VSS and the fourth transistor in series using a voltage of the output terminal of the third inverter INV3 (input terminal of the fourth inverter INV4) as a gate voltage. The fourth transistor T4 may connect between the match line ML terminal and the third transistor T3 in series using a voltage of a true search line SLT terminal as a gate voltage.

Opposite signals may be applied to the true bit line BLT and the complementary bit line BLC. Opposite signals may be applied to the true search line SLT and the complementary search line SLC. As used herein, "opposite signals" indicates signals having opposite meanings to each other in a binary system such as "1" and "0" or "+" and "−," e.g., opposite digital signals in a digital circuit.

Figure 9:
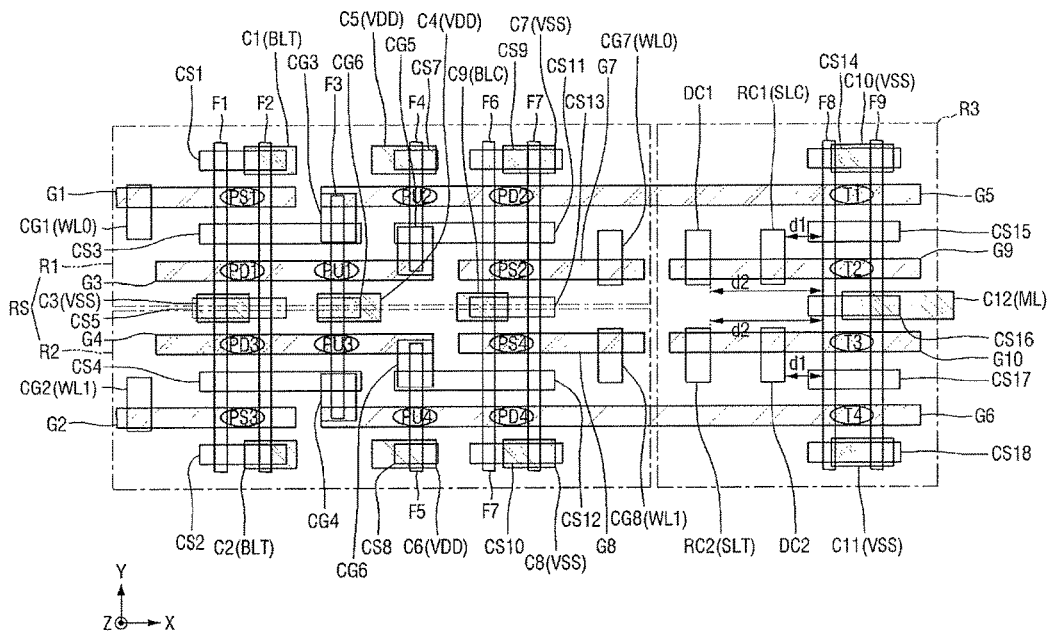
FIG. 9 illustrates a layout embodiment matching the circuit in FIG. 8.

Referring to FIGS. 8 and 9, the first and second fins F1, F2 and the first gate electrode G1 may form the first pass-gate transistor PS1. The sixth and seventh fins F6, F7 and the seventh gate electrode G7 may form the second pass-gate transistor PS2. Similarly, the first and second fins F1, F2 and the second gate electrode G2 may form the second pass-gate transistor PS2. The sixth and seventh fins F6, F7 and the eighth gate electrode G8 may form the fourth pass-gate transistor PS4.

The first and second fins F1, F2 and the third gate electrode G3 may form the first pull-down transistor PD1. The sixth and seventh fins F6, F7 and the fifth gate electrode G5 may form the second pull-down transistor PD2. Similarly, the first and second fins F1, F2 and the fourth gate electrode G4 may form the third pull-down transistor PD3. The sixth and seventh fins F6, F7 and the sixth gate electrode G6 may form the fourth pull-down transistor PD4.

The third fin F3 and the third gate electrode G3 may form the first pull-up transistor PU1. The fourth fin F4 and the fifth gate electrode G5 may form the second pull-up transistor PU2. Similarly, the third fin F3 and the fourth gate electrode G4 may form the third pull-up transistor PU3. The fourth fin F4 and the sixth gate electrode G6 may form the fourth pull-up transistor PU4.

The eighth and ninth fins F8, F9 and the fifth gate electrode G5 may form the first transistor T1. The eighth and ninth F8, F9 and the ninth gate electrode G9 may form the second transistor T2. Similarly, the eighth and ninth fins F8, F9 and the tenth gate electrode G10 may form the third transistor T3. The eighth and ninth fins F8, F9 and the sixth gate electrode G6 may form the fourth transistor T4.

Referring to FIGS. 4, 8, and 9, the first and seventh gate contacts GC1, GC7 may be connected with the second upper wire M2, to form a first word line WL0 terminal. The second and eighth gate contacts GC2, GC8 may be connected with the fourth upper wire M4, to form a second word line WL1 terminal.

The third upper contact C3 may be formed with the ground terminal VSS. Further, the seventh and eighth upper contacts C7, C8 may be connected with the seventh lower wire L7, to form the ground terminal VSS. Further, the tenth and eleventh upper contacts C10, C11 may be connected with the twelfth lower wire L12, to form the ground terminal VSS.

The first and second upper contacts C1, C2 may be connected with the fourth lower wire L4, to form a true bit line BLT terminal. The fourth to sixth upper contacts C4-C6 may be connected with the fifth lower wire L5, to form the power terminal VDD. The ninth upper contact C9 may be formed with the complementary bit line BLC terminal.

The twelfth upper contact C12 may be formed with the match line ML terminal. The first real contact RC1 may be formed with the complementary search line SLC terminal. Conversely, the second real contact RC2 may be formed with the true search line SLT terminal.

According to some exemplary embodiments, the first region R1 and the second region R2 of the semiconductor device may be divided into a data cell part and a mask cell part. The first region R1 or the second region R2 may be the data cell. For the sake of discussion, the first region R1 will be assumed to be the data cell.

The process of writing data firstly stores data in the first region R1 through the true bit line BLT and stores mask data in the second region R2. When both the data cell and the mask cell are stored as '0', such data may represent a 'don't care' value. This is a value including both '1' and '0'.

When searching data, the first word line WL0 and the second word line WL1 may be set to be 'OFF' and the match line ML terminal may be pre-charged. Next, the complementary search line SLC may be turned 'ON'. At the same time point, the true search line SLT may be 'OFF'. Thus, the pre-charge time point may be earlier than an 'ON' time point of the complementary search line SLC.

When the data stored in the first region R1 (gate voltage signal of T1) is '0', the pre-charged match line ML terminal maintains 'HIGH' state (e.g., '1' state), which represents a match state. When the data stored in the first region R1 (gate voltage signal of T1) is '1', the first transistor T1 is turned on and a match line ML terminal value is discharged to be changed into 'LOW' state (e.g., '0' state), thus representing a 'no match' state. Thus, an output time point of the match line ML terminal value may be later than 'ON' time point of the complementary search line SLC.

Figure 10:
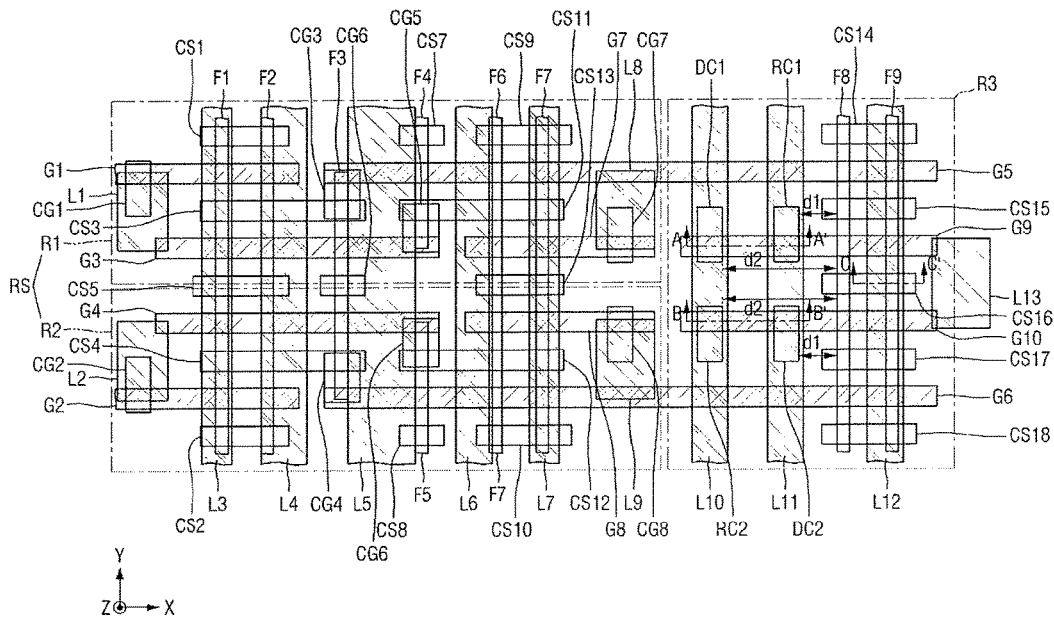
FIG. 10 illustrates another layout embodiment of a semiconductor device.
Figure 11:
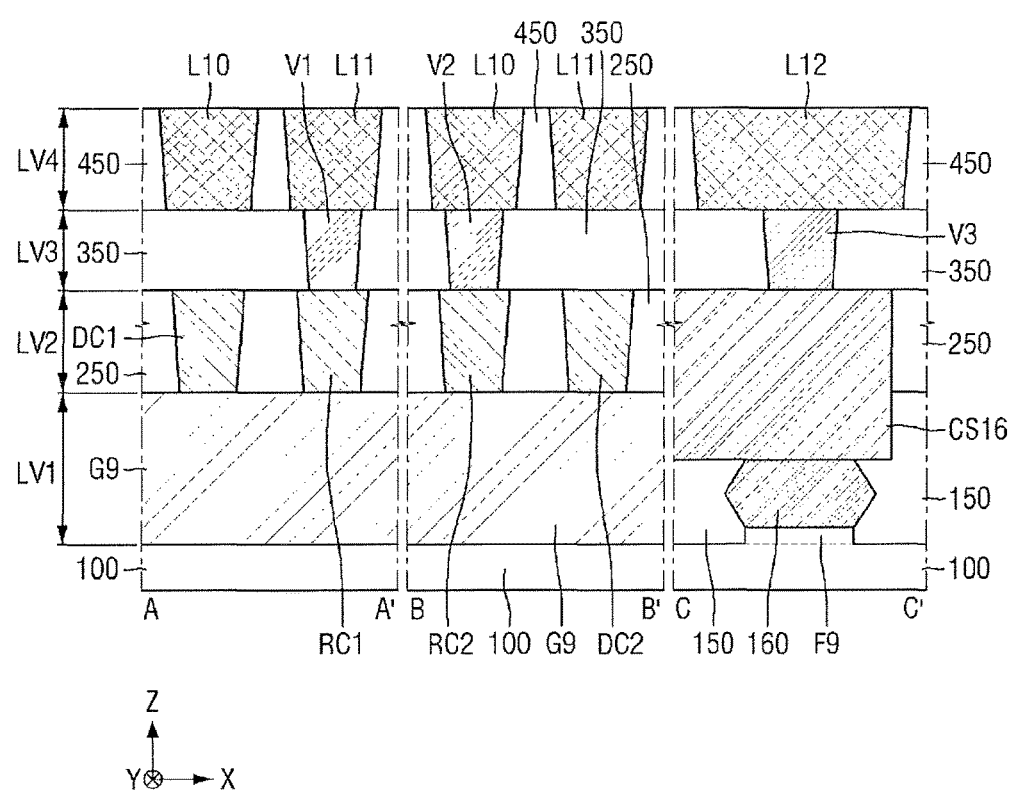
FIG. 11 illustrates a view along section lines A-A', B-B' and C-C' in FIG. 10.

FIG. 10 is another layout embodiment of a semiconductor device, and FIG. 11 is a cross-sectional view taken on lines A-A', B-B' and C-C' of FIG. 10. Referring to FIGS. 10 and 11, an embodiments excluding the first to twelfth upper contacts C1-C12 from the embodiments described in FIGS. 1 to 9 will be described.

The first to eighteenth lower contacts CS1-CS18 may be in contact directly with a via such as the third via V3 on the first and second levels LV1, LV2. For example, the source/drain in the embodiments described with reference to FIGS. 1 to 9 may be electrically connected with the first to thirteenth lower wires L1-L13 after passing through the first to eighteenth lower contacts CS1-CS18, the first to twelfth upper contacts C1-C12, and the via.

According to an exemplary embodiment, the first to eighteenth lower contacts CS1-CS18 may be electrically connected with the first to thirteenth lower wires L1-L13 directly through the source/drain and the via such as the third via V3.

As a result, the semiconductor device according to some exemplary embodiments may reduce or minimize an adequate space margin. For example, when two layers of the first to eighteenth lower contacts CS1-CS18 and the first to twelfth upper contacts C1-C12 are used, etching and patterning processes must be performed twice and a masking job for the above processes is also required. Such a multi-process should be secured with space margin due to misalignment.

As the horizontal scale of the semiconductor device gradually decreases, it becomes increasingly difficult to secure an adequate space margin. Therefore, the semiconductor device according to some exemplary embodiments may form a contact structure only with the first to eighteenth lower contacts CS1-CS18, while excluding the upper contact, on the first level LV1 and the second level LV2 in order to reduce or minimize the need to secure space margin and also reduce or minimize process waste and process cost.

Figure 12:
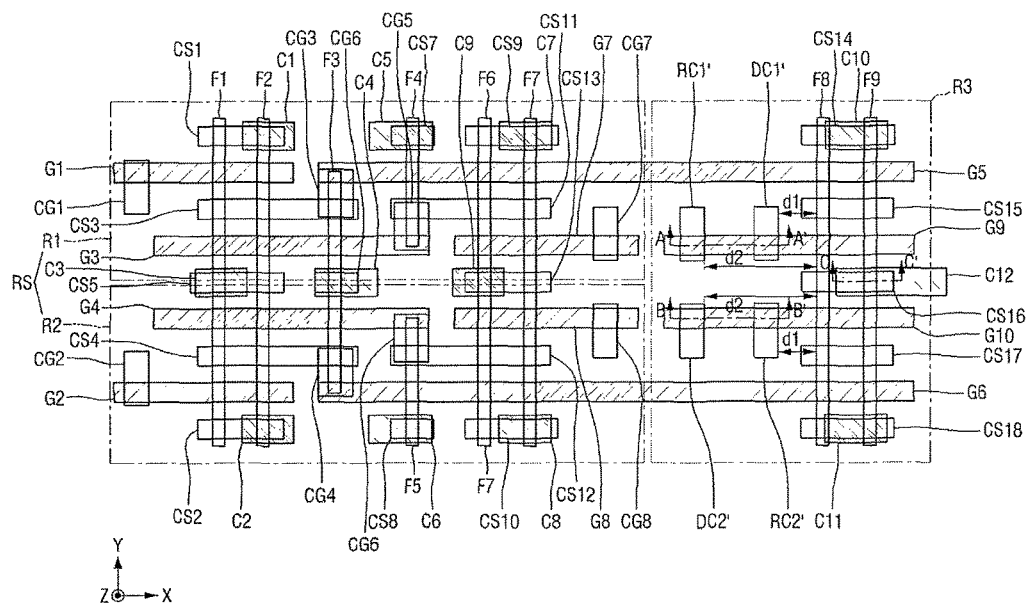
FIG. 12 illustrates another layout embodiment of a semiconductor device.
Figure 13:
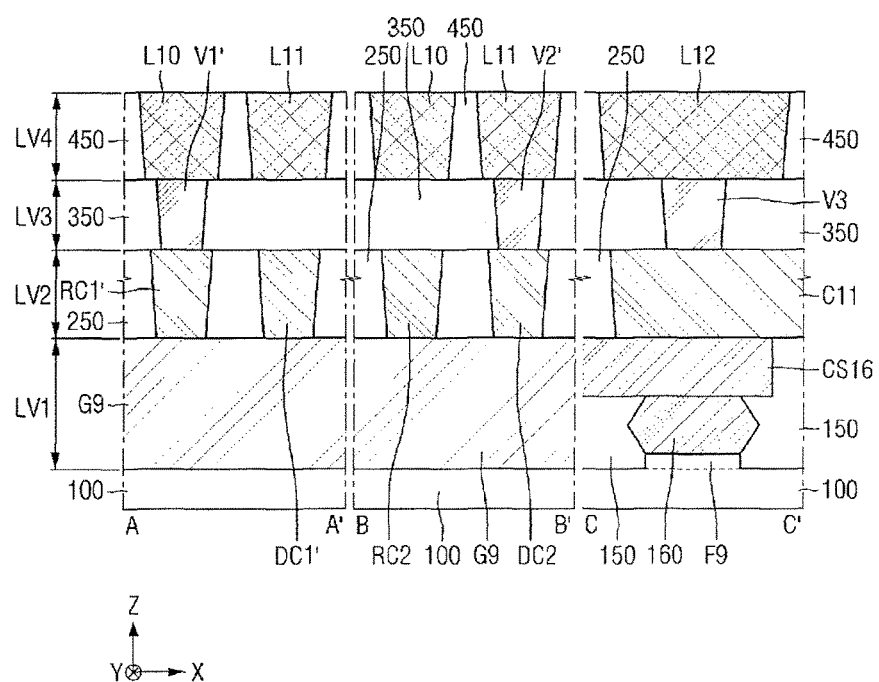
FIG. 13 illustrates a view along section lines A-A', B-B' and C-C' in FIG. 12'

FIG. 12 illustrate a layout embodiment of a semiconductor device according to some exemplary embodiments. FIG. 13 illustrates a cross-sectional view taken on lines A-A', B-B', and C-C' in FIG. 12.

Referring to FIGS. 12 and 13, positions of the first and second real contacts RC1', RC2' and the first and second dummy contacts DC1', DC2' in the semiconductor device according to some exemplary embodiments may be contrary to the embodiments of FIGS. 1 to 11. For example, the first real contact RC1' may be spaced by the second distance d2 from the transistor formed with the eighth and ninth fins F8, F9 and the ninth gate electrode G9, on the ninth gate electrode G9. The second real contact RC2' may be spaced by the first distance d1 from the transistor formed with the eighth and ninth fins F8, F9 and the tenth gate electrode G10, on the tenth gate electrode G10. The first distance d1 may be different from (e.g., smaller than) the second distance d2.

In one embodiment, in order for the tenth lower wire L10 and the eleventh lower wire L11 to extend in the second direction Y without interfering with each other, only the distances of the first and second real contacts RC1', RC2' may be different from each other. Accordingly, the distance of the first real contact RC1' does not necessarily have to be less than that of the second real contact RC2'.

Even in this case, since asymmetry may still be present, the first and second dummy contacts DC1', DC2' may be provided, and positions of the first and second dummy contacts DC1', DC2' may be different according to positions of the first and second real contacts RC1', RC2'. For example, the first dummy contact DC1' may be spaced by the first distance d1 from the transistor formed with the eighth and ninth fins F8, F9 and the ninth gate electrode G9, on the ninth gate electrode G9. Further, the second dummy contact DC2' may be spaced by the second distance d2 from the transistor formed with the eighth and ninth fins F8, F9 and the tenth gate electrode G10, on the tenth gate electrode G10.

The first to third vias V1', V2', V3 may be formed on the third level LV3. The vias may electrically connect the first and second real contacts RC1', RC2', the first to eighth gate contacts CG1-CG8 and the first to twelfth upper contacts C1-C12 with the first to thirteenth lower wires L1-L13. A third interlayer insulating film 350 may be formed on a portion where the above constituent elements are not formed.

The first via V1' may connect the first real contact RC1' with the tenth lower wire L10. The eleventh lower wire L11 and the first dummy contact DC1' may overlap each other in the third direction Z, but may be insulated from each other. Likewise, the second via V2' may connect the second real contact RC2' with the eleventh lower wire L11. The tenth lower wire L10 and the second dummy contact DC2 may overlap each other in the third direction Z, but may be insulated from each other.

Figure 14:
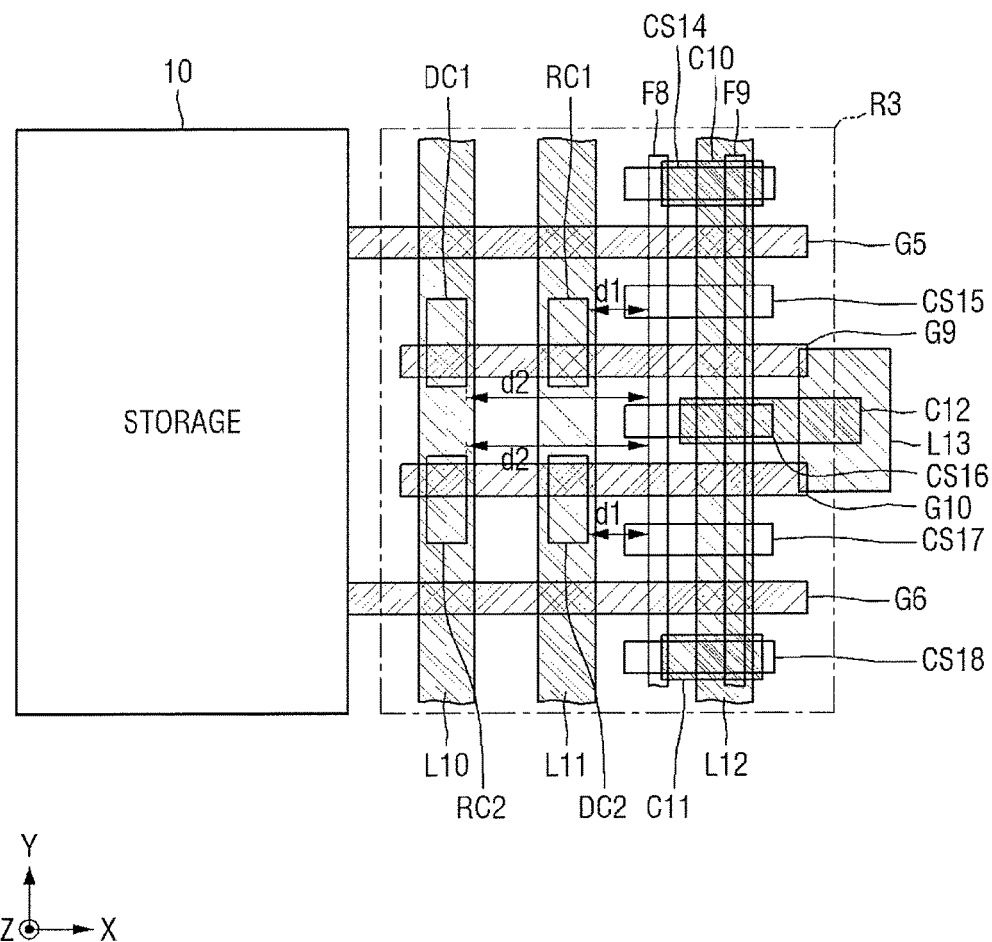
FIG. 14 illustrates another layout embodiment of a semiconductor device.

FIG. 14 illustrates another layout embodiment of a semiconductor device which may include the storage device 10 and the third region R3. The third region R3 is a comparison region as in the exemplary embodiments described above, which may form a CAM port region. The third region R3 may perform an operation of comparing two signals through the fifth gate electrode G5 and the sixth gate electrode G6.

The storage device 10 may be a storage device connected with the fifth gate electrode G5 and the sixth gate electrode G6 of the third region R3. In one embodiment, the storage device 10 may include two 8 transistor (8T) SRAM cell structures as in FIG. 1. The storage device 10 may have a symmetrical layout about the first direction X as an axis. For example, when the storage device 10 is cut along a virtual line extending in the first direction X from a center of the second direction Y of the storage device 10, the two parts divided with the virtual line may be symmetrical about the virtual line extending in the first direction X.

Accordingly, only the first and second real contacts RC1, RC2 of the third region R3 may form to be asymmetrical. In order to prevent asymmetry, the first and second dummy contacts DC1, DC2 may be formed. With the presence of the first and second dummy contacts DC1, DC2, symmetry of not only the third region R3, but also the semiconductor device including the storage device 10 according to some exemplary embodiments, may be recovered.

FIGS. 15 to 18 illustrate stages of an embodiment of a method for fabricating a semiconductor device. For illustrative purposes, the method will be explained with reference to FIGS. 1 to 7 and 15 to 18.

Figure 15:
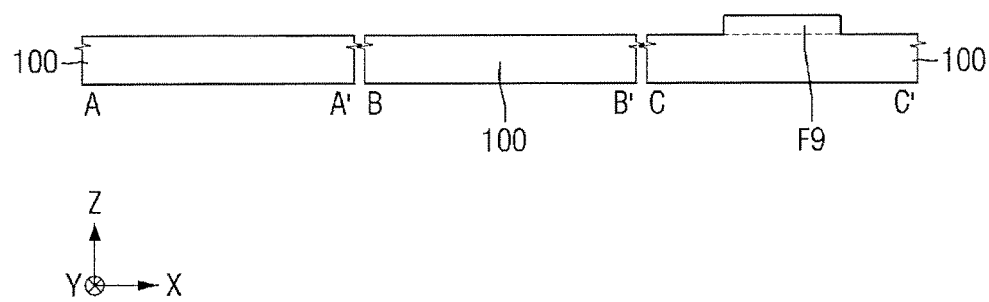
FIGS. 15 to 18 illustrate stages of an embodiment of a method for fabricating a semiconductor device.

Referring first to FIGS. 2 and 15, the first to ninth fins F1-F9 may be formed to extend in the second direction Y on the substrate 100. The first to ninth fins F1-F9 may protrude from the substrate 100 in the third direction Z. Each of the first to ninth fins F1-F9 may extend longitudinally along a length direction, e.g., in the second direction Y. The first to ninth fins F1-F9 may have a long side and a short side. The long side direction is illustrated to be the second direction Y and the short side direction is illustrated to be the first direction X, but the short and long sides may extend in other directions in another embodiment. The first to ninth fins F1-F9 may be a part of the substrate 100 and may include an epitaxial layer grown from the substrate 100. For example, the first to ninth fins F1-F9 may include Si or SiGe.

Figure 16:
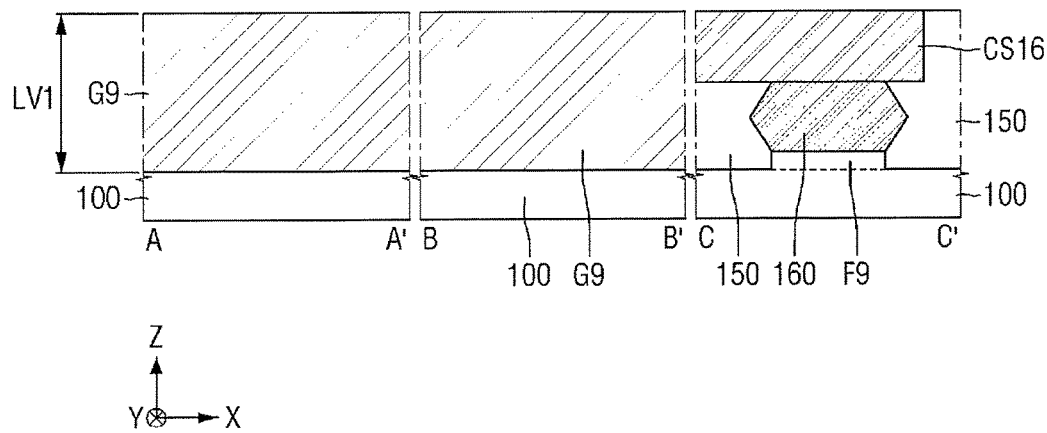

Next, referring to FIGS. 2, 6 and 16, the first to tenth gate electrodes G1-G10 may be formed. The first to tenth gate electrodes G1-G10 may extend in the first direction X. The first to tenth gate electrodes G1-G10 may be formed on and intersect with the first to ninth fins F1-F9. The first to tenth gate electrodes G1-G10 and the first to ninth fins F1-F9 may be formed, for example, as illustrated in FIG. 2.

Next, referring to FIG. 6, the gate spacer 170 may be formed on side surfaces of the first to tenth gate electrodes G1-G10. The gate spacer 170 may include at least one of an oxide film, a nitride film, or an oxynitride film. The gate spacer 170 is illustrated to be a single-layered film, but may be a multi-layered film in another embodiment. The gate spacer 170 may have, for example, an I shape or L shape.

Next, a recess may be formed within the first to ninth fins F1-F9 on the side surfaces of the first to tenth gate electrodes G1-G10, and the source/drain may be formed in the recess. A cross section of the source/drain in the second direction Y may be, for example, a pentagonal or hexagonal shape, as in the first source/drain 160 of FIG. 16, but not limited hereto. A cross section of the source/drain in the first direction X may have a shape of being buried within the fin as in the second source/drain 120 of FIG. 6.

Next, referring to FIGS. 3 and 16, the first to eighteenth lower contacts CS1-CS18 may be formed on the source/drain. By doing so, all constituent elements of the first level LV1 may be formed.

Figure 17:
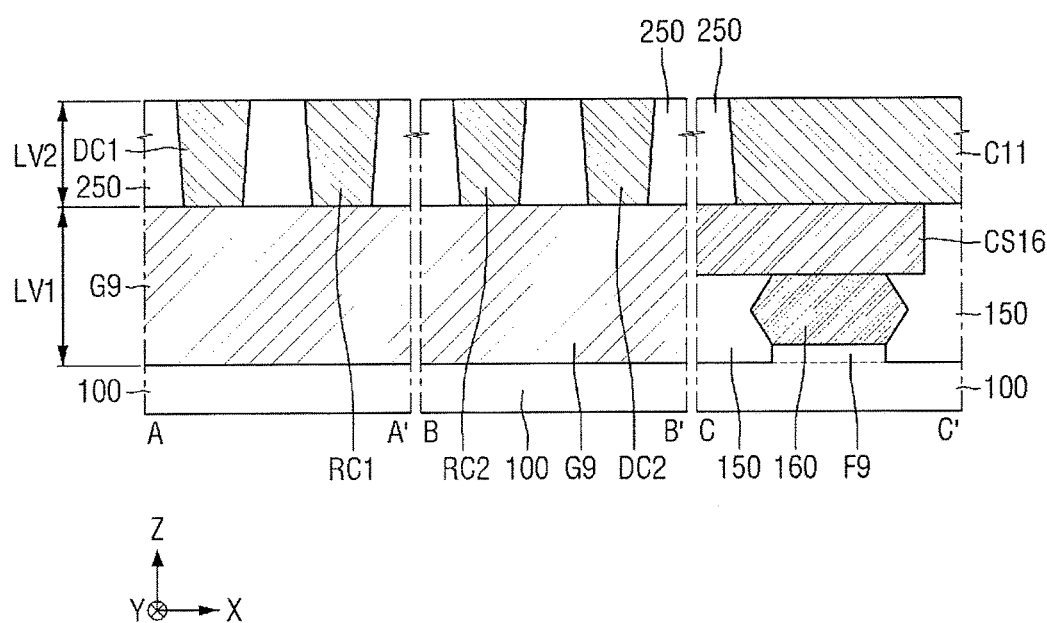

Next, referring to FIGS. 3 and 17, the first to eighth gate contacts CG1-CG8, the first and second real contacts RC1, RC2, and the first and second dummy contacts DC1, DC2 may be formed on the first to tenth gate electrodes G1-G10. Concurrently, the first to twelfth upper contacts C1-C12 may be formed on the first to eighteenth lower contacts CS1-CS18. The constituent elements mentioned above may be formed on the second level LV2, for example, as illustrated in FIG. 3.

The expression "simultaneous" may include the situation where the same process is used to form features or perform operations and/or may correspond to minute time differences.

The first to eighteenth lower contacts CS1-CS18 were indicated to be formed before the first to eighth gate contacts CG1-CG8, the first and second real contacts RC1, RC2, and the first and second dummy contacts DC1, DC2. In one embodiment, the foregoing features may be formed in a different order.

Figure 18:
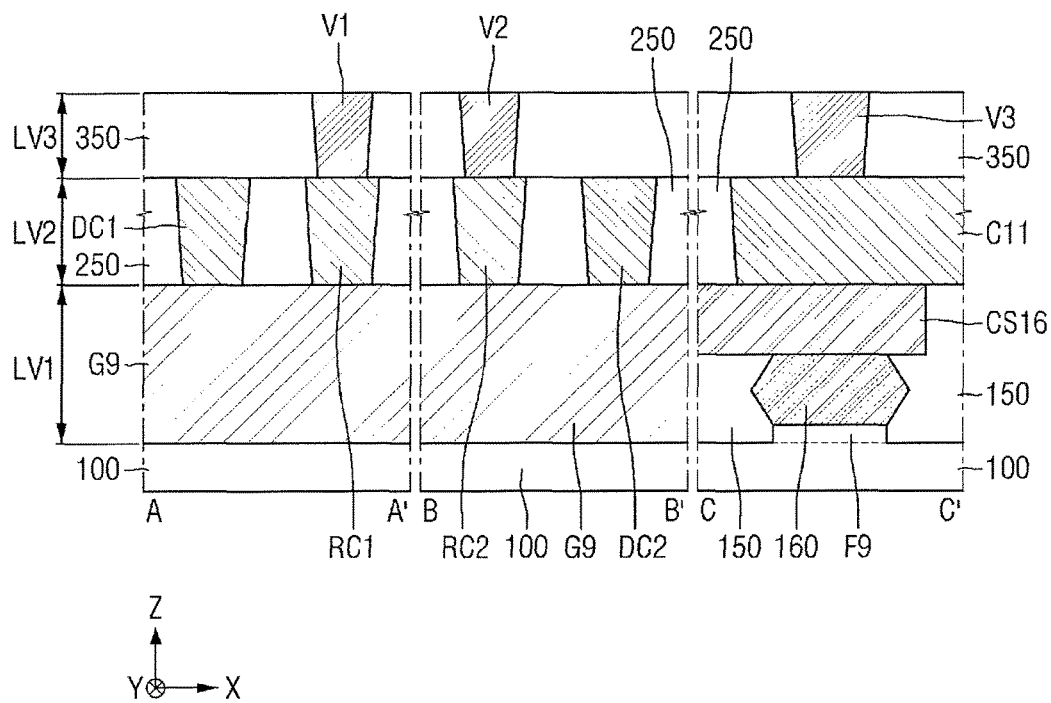

Next, referring to FIG. 18, the first to third vias V1-V3 may be formed on the third level LV3. The first via V1 may connect the first real contact RC1 and the eleventh lower wire L11. The tenth lower wire L10 and the first dummy contact DC1 may overlap each other in the third direction Z, but may be insulated from each other.

The second via V2 may connect the second real contact RC2 and the tenth lower wire L10. The eleventh lower wire L11 and the second dummy contact DC2 may overlap each other in the third direction Z, but may be insulated from each other.

The third via V3 may connect the eleventh upper contact C11 and the twelfth lower wire L12. The via such as the third via V3 may connect the first to twelfth upper contacts C1-C12 and the first to thirteenth lower wires L1-L13.

Next, referring to FIGS. 1 and 5, the first to thirteenth lower wires L1-L13 may be formed. The first to thirteenth lower wires L1-L13 may be formed, for example, in the shape of the layout in FIG. 1 on the fourth level LV4.

Next, referring to FIGS. 4 and 7, the first to seventh contacts MC1-MC7 may be formed. The first to seventh contacts MC1-MC7 may be disposed, for example, in the shape of the layout of FIG. 4 on the fifth level LV5.

Next, the first to fifth upper wires M1-M5 may be formed. The first to fifth upper wires M1-M5 may be disposed, for example, in the shape of the layout in FIG. 4 on the sixth level LV6.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor device, comprising:
    a fin extending in a first direction;
    first to fourth gate electrodes intersecting the fin;
    first and second storage devices connected with the first and fourth gate electrodes respectively;
    a first search terminal connected with the second gate electrode and spaced from the fin by a first distance;
    a second search terminal connected with the third gate electrode and spaced from the fin by a second distance different from the first distance;
    a first dummy search terminal connected with the second gate electrode and spaced from the fin by the second distance; and
    a second dummy search terminal connected with the third gate electrode and spaced from the fin by the first distance.

2. The semiconductor device as claimed in claim 1, wherein the first search terminal and the second search terminal are to receive opposite signals.

3. The semiconductor device as claimed in claim 1, further comprising:
    a first wire on the first search terminal and the second dummy search terminal, the first wire extending in the first direction and overlapping the first search terminal and the second dummy search terminal; and
    a second wire on the second search terminal and the first dummy search terminal, the second wire extending in the first direction and overlapping the second search terminal and the first dummy search terminal.

4. The semiconductor device as claimed in claim 3, wherein:
    the first wire is electrically connected with the first search terminal and electrically insulated from the second search terminal, and
    the second wire is electrically connected with the second search terminal and electrically insulated from the first search terminal.

5. The semiconductor device as claimed in claim 3, wherein the first and second wires are parallel and on a same level.

6. The semiconductor device as claimed in claim 3, further comprising:
    a match terminal on the fin between the second and third gate electrodes; and
    a third wire formed on a same level as the first and second wires and electrically connected with the match terminal.

7. The semiconductor device as claimed in claim 1, wherein the fin includes first and second fins spaced apart from each other in a second direction intersecting the first direction.

8. The semiconductor device as claimed in claim 1, wherein layouts of the first and second storage devices are symmetrical to each other in the first direction.

9. The semiconductor device as claimed in claim 1, wherein lengths of the second and third gate electrodes are equal to each other.

10. The semiconductor device as claimed in claim 1, further comprising:
    a first transistor including the second gate electrode and the fin; and
    a second transistor including the third gate electrode and the fin,
    wherein threshold voltages of the first and second transistors are equal to each other.

11. The semiconductor device as claimed in claim 10, further comprising:
    a first source/drain on the first gate electrode opposite to the direction of the second gate electrode;

a second source/drain formed on the second gate electrode opposite to the direction of the third gate electrode; and first and second ground terminals on the first and second source/drains respectively.

12. A semiconductor device, comprising:

first to sixth fins extending in parallel in a first direction, the first to third, fifth, and sixth fins sequentially spaced in a second direction crossing the first direction, the first, second, and fourth to sixth fins sequentially spaced in the second direction, and the third and fourth fins spaced in the first direction;

a first gate electrode intersecting the first, second, and third fins and extending in the second direction;

a second gate electrode intersecting the first, second, and fourth fins and extending in the second direction;

a third gate electrode intersecting the second, third, fifth, and sixth fins and extending in the second direction;

a fourth gate electrode intersecting the second and fourth to sixth fins and extending in the second direction;

fifth and sixth gate electrodes between the third and fourth gate electrodes, intersecting the sixth fin, and extending in the second direction, the fifth and sixth gate electrodes spaced apart from each other in the first direction;

a first search terminal connected with the fifth gate electrode and spaced from the sixth fin by a first distance;

a second search terminal connected with the sixth gate electrode and spaced from the sixth fin by a second distance different from the first distance;

a first dummy search terminal connected with the fifth gate electrode and spaced from the sixth fin by the second distance; and a second dummy search terminal connected with the sixth gate electrode and spaced from the sixth fin by the first distance.

13. The semiconductor device as claimed in claim 12, wherein the first search terminal and the second search terminal are to receive opposite signals.

14. The semiconductor device as claimed in claim 12, wherein:

the first to fourth fins are in a storage region, the fifth and sixth fins are in a comparison region, and the storage region and the comparison region are electrically connected by the first and second gate electrodes.

15. The semiconductor device as claimed in claim 14, wherein:

the storage region includes first and second storage regions adjacent to each other in the first direction, a boundary line of the first and second storage regions extending in the second direction, and layouts of the first and second storage regions are symmetrical to each other about the boundary line extending in the second direction as an axis.

16. The semiconductor device as claimed in claim 15, wherein the boundary line is between the first and second gate electrodes.

17. The semiconductor device as claimed in claim 12, wherein:

the first and fifth gate electrodes overlap each other in the second direction and are spaced apart from each other in the second direction, and the second and sixth gate electrodes overlap each other in the second direction and are spaced in the second direction.

18. A semiconductor device, comprising:

a fin extending in a first direction;

first and second gate electrodes intersecting the fin;

a first search terminal connected with the first gate electrode and spaced from the fin by a first distance;

a second search terminal connected with the second gate electrode and spaced from the fin by a second distance different from the first distance;

a first dummy search terminal connected with the first gate electrode and spaced from the fin by the second distance;

a second dummy search terminal connected with the second gate electrode and spaced from the fin by the first distance;

a first wire extending in the first direction on the first search terminal and the second dummy search terminal, the first wire electrically connected with the first search terminal and electrically insulated from the second dummy search terminal; and a second wire extending in the first direction on the second search terminal and the first dummy search terminal, the second wire electrically connected with the second search terminal and electrically insulated from the first dummy search terminal.

19. The semiconductor device as claimed in claim 18, wherein the first search terminal and the second search terminal are to receive opposite signals.

20. The semiconductor device as claimed in claim 18, wherein:

the first and second gate electrodes are on a first level, the first and second wires are on a fourth level on the first level, a second level and a third level on the second level are between the first and fourth levels, and the first to fourth levels correspond to levels in a vertical direction.

* * * * *